(12) United States Patent
Mosesov

(10) Patent No.: US 7,489,209 B2
(45) Date of Patent: Feb. 10, 2009

(54) HIGH STABILITY FAST START UP OSCILLATOR FOR IMPLANTS

(75) Inventor: Oleg Mosesov, Maple Grove, MN (US)

(73) Assignee: Transoma Medical, Inc., St. Paul, MN (US)

( * ) Notice: Subject to any disclaimer, the term of this patent is extended or adjusted under 35 U.S.C. 154(b) by 61 days.

(21) Appl. No.: 11/409,224

(22) Filed: Apr. 20, 2006

(65) Prior Publication Data

US 2007/0247247 A1    Oct. 25, 2007

(51) Int. Cl.
  H03B 5/32   (2006.01)
  H03B 5/30   (2006.01)
  H03B 5/36   (2006.01)
  H03L 7/099  (2006.01)
  H03K 3/354  (2006.01)

(52) U.S. Cl. .................. 331/167; 331/158; 331/116 R; 331/116 FE; 331/185

(58) Field of Classification Search .................. 331/160, 331/182, 183, 176, 117 R, 117 FE, 117 D, 331/116 R, 116 FE, 179, 158, 185
See application file for complete search history.

(56) References Cited

U.S. PATENT DOCUMENTS

| | | | |
|---|---|---|---|
| 4,551,691 A * | 11/1985 | Ogawa | ........................ 331/111 |
| 4,794,622 A * | 12/1988 | Isaacman et al. | ............ 375/312 |
| 5,155,453 A | 10/1992 | Ruetz | |
| 5,254,961 A | 10/1993 | Ruetz | |
| 5,325,074 A | 6/1994 | Suenaga | |
| 5,834,982 A | 11/1998 | Watanabe et al. | |
| 6,137,374 A | 10/2000 | Merrill | |
| 6,163,228 A * | 12/2000 | Pope | ....................... 331/117 R |

(Continued)

FOREIGN PATENT DOCUMENTS

GB    2 317 761 A    4/1998

OTHER PUBLICATIONS

"Fast Start-Up Oscillator (FOX) Boosts Superhet Performance," downloaded from http://www.maxim-ic.com/appnotes.cfm/appnote_number/1955.

"Preserve Energy-With the AVR Low Power Microcontrollers," downloaded from http://www.atmel.com/dyn/resources/prod_documents/doc4060.pdf.

(Continued)

Primary Examiner—Robert Pascal
Assistant Examiner—Gerald Stevens
(74) Attorney, Agent, or Firm—Fish & Richardson P.C.

(57) ABSTRACT

An oscillator for use within an implantable medical device is provided. The oscillator includes a resonator and a first switch coupled to a first resistive network. The first resistive network provides a first electrical path through the first switch and a second electrical path not going through the switch. The oscillator additionally includes a second switch coupled to a second resistive network. The second resistive network provides a third electrical path through the second switch and a fourth electrical path not going through the switch. Furthermore, the oscillator includes a transistor, the base terminal coupled with the first resistive network and the resonator and the emitter terminal coupled to the fourth resistor. The second electrical path with the first switch opened has a substantially higher resistance than the first electrical path when the first switch is closed. In addition, the fourth electrical path with the second switch opened has a substantially higher resistance than the third electrical path when the second switch is closed.

20 Claims, 5 Drawing Sheets

U.S. PATENT DOCUMENTS 6,774,735 B2 8/2004 Senthilkumar et al.
6,943,639 B2 9/2005 Dahlin
7,123,109 B2 * 10/2006 Stevenson et al. ........... 331/109
2002/0079977 A1 * 6/2002 Sakai ........................... 331/74
2005/0007205 A1 1/2005 Bridger

OTHER PUBLICATIONS

"2.4 GHz Radio Transceiver, Single Cycle 8051 MCU abd 32 kB Flash Memory-All In One Chip," downloaded from http://www.chipcon.com/index.cfm?kat_id=2&subkat_id=12&dok_id=258.

* cited by examiner

HIGH STABILITY FAST START UP OSCILLATOR FOR IMPLANTS

CROSS-REFERENCES TO RELATED APPLICATIONS

Not Applicable

BACKGROUND OF THE INVENTION

The present invention is directed to implantable medical devices and their use in monitoring physiological parameters within a patient's body. More particularly, the invention provides a high stability fast start-up oscillator for implantable medical devices. The oscillator is maintained in a first current mode using a low current and switched to a second current mode utilizing a higher current. The transition between current modes provides for a reduced startup time without consuming significantly more power. However, it would be recognized that the invention has a much broader range of applicability.

The use of implantable medical devices has become increasingly commonplace as an effective method of monitoring the state and condition of a living body. An implantable medical device can be implanted within a human or an animal to monitor physiological parameters about the patient's well-being. By being implanted directly within the body, implantable medical devices can provide continuous monitoring of the patient's condition without requiring continuous onsite care by a caregiver or a physician. Implantable medical devices can also provide therapy within the body to change or improve the patient's physical state based on the physiological parameters received from sensors or the like. Implantable devices have been used to help treat a variety of physical disorders, such as heart disease, deafness, and diabetes with a large degree of success.

As implantable medical devices are powered on and off, they can consume a significant amount of power during its operation. Implantable medical devices typically use an internal battery to power the device. The battery life or operational time that the implantable medical device can be used is an important factor in the design of the devices as a shortened battery life may require additional surgery to replace or recharge the device at an unwanted time for the patient. For this reason, it is desirable to reduce the power consumption within the implantable medical device to increase its time duration of operation.

Because of the power requirements needed to continuously sustain an implantable medical device, the implantable medical device may use a sleep state where the device is kept in a low-current usage state. The implantable medical device periodically looks or "sniffs" for a wake-up signal from an external device. Upon receiving the wake-up signal, the implantable medical device can be powered on to normal operation which utilizes significantly more current than during the sleep state. Alternatively, a duty cycle mode can be used by an implantable medical device to achieve lower power consumption, where the device is turned on during operation for a short time period and turned off following operation. Power savings can be achieved by duty cycling in that the implantable device is not continuously on.

One example of a device that can be included within an implantable medical device is a resonator oscillator that can be used for wireless communications. For example, resonator oscillators often utilize a quartz crystal as a resonance element to assist in starting up and shutting down the implant. The oscillator is maintained at an OFF state during the time when the implant is not operating to conserve power and is turned ON when the implant is in use. However, the transition from the OFF state to an on state can be quite long. For example, the start up time for a 10 MHz crystal, for instance, can be about 1-10 ms, which results in a slow duty cycle. The longer the start up time of the device, the higher duty cycle percentage that is needed to operate the implant.

A new oscillator and method of use could be developed which reduces the start up time of the device while not consuming significantly more current than before.

BRIEF SUMMARY OF THE INVENTION

The present invention is directed to implantable medical devices and their use in monitoring physiological parameters within a patient's body. More particularly, the invention provides a high stability fast start-up oscillator for implantable medical devices. The oscillator is maintained in a first current mode using a low current and switched to a second current mode utilizing a higher current. The transition between current modes provides for a reduced startup time without consuming significantly more power. However, it would be recognized that the invention has a much broader range of applicability.

In accordance with an aspect of the present invention, an oscillator for use within an implantable medical device is provided. The oscillator includes a resonator crystal and a first switch coupled to a first resistive network. The first resistive network provides a first electrical path through the first switch and a second electrical path not going through the switch. The oscillator additionally includes a second switch coupled to a second resistive network. The second resistive network provides a third electrical path through the second switch and a fourth electrical path not going through the switch. Furthermore, the oscillator includes a transistor, the base terminal coupled with the first resistive network and the resonator crystal and the emitter terminal coupled to the fourth resistor. The second electrical path with the first switch opened has a substantially higher resistance than the first electrical path when the first switch is closed. In addition, the fourth electrical path with the second switch opened has a substantially higher resistance than the third electrical path when the second switch is closed.

In some embodiments, the oscillator may further include a tank circuit coupled to the collector terminal of an NPN transistor. The tank circuit may include a capacitor, a third variable capacitor, and an inductor coupled in parallel. The first resistive network may include a first resistor coupled in parallel with the first switch, the first resistor and the first switch both further coupled in series to a second resistor, or the second resistive network may include a third resistor coupled in parallel with the second switch, the third resistor and the second switch both further coupled in series to a fourth resistor. Alternatively, the first resistive network may include a first resistor coupled in series with the first switch, with the first resistor and the first switch further coupled in parallel with a second resistor, or the second network may include a third resistor coupled in series with the second switch, with the third resistor and the second switch further coupled in parallel with a fourth resistor. Signals may be input into the switches from an external source, the signals controlling an open or closed state of the switches. The first and second switches may be opened at the same time or closed at the same time. The resonator may be made from a crystal or ceramic material, or the resonator may be a 8 MHz resonator. One or more of the switches may be analog switches. The duty cycle of the oscillator may be about 1% or less.

In accordance with another aspect of the invention, a method of operation for a dual-mode oscillator is provided. The method includes providing an oscillator that includes a resonator, a base switch and an emitter switch. The base switch is coupled to a first resistive network and the emitter switch is coupled to a second resistive network. The method further includes operating the oscillator within a first current mode wherein the base and emitter switches are open and a first current is applied to the resonating element through the first and second resistive networks. In addition, the method includes receiving a signal from an external source to switch the oscillator to a second current mode. Furthermore, the method includes operating the oscillator within the second current mode wherein the base and emitter switches are closed providing a lower resistance path through the first and second resistive networks for a second current applied to the resonating element. The second current is substantially larger than the first current.

In some embodiments, the period between the first current mode and the second current mode may be less than about 1 ms. The first current may be about 2.2-2.7 µA, while the second current is about 0.5-1 mA. The signal input to the oscillator may be a pulsed signal about 5-10 µs. The method of operation may also include returning the oscillator to operation within the first current mode when the signal from an external source is no longer received.

DETAILED DESCRIPTION OF THE INVENTION

Figure 1:
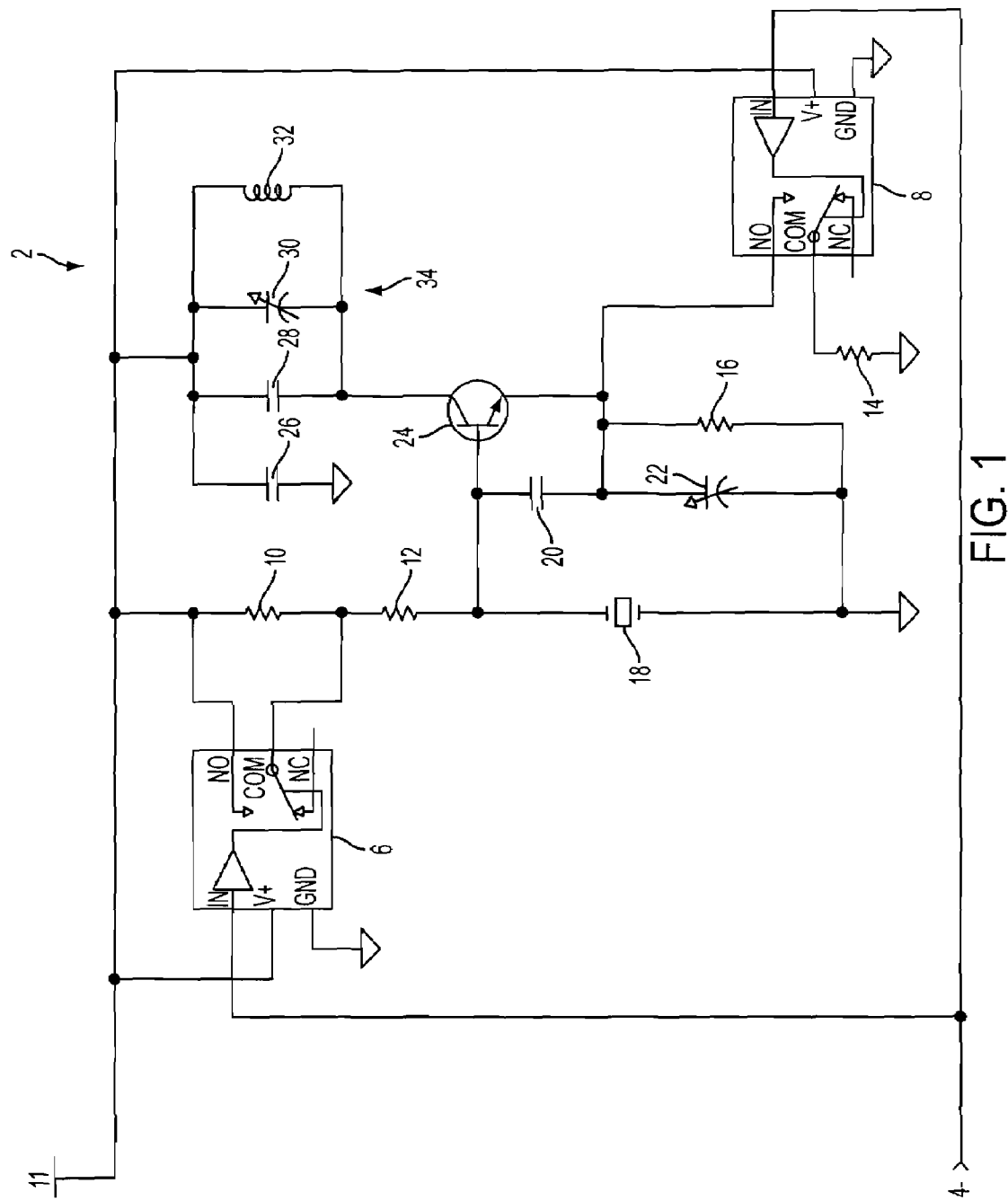
FIG. 1 is a simplified exemplary drawing of an oscillator according to an embodiment of the present invention.

FIG. 1 is a simplified exemplary drawing of an oscillator according to an embodiment of the present invention. A signal 4 from a pulse generator (not shown) is input to an oscillator circuit 2 and sent to pins on switches 6 and 8. For example, the signal sent may be a pulsed signal to optimize the duration and battery life of the implantable device which contains the oscillator circuit. Of course, alternatives to a pulsed signal such as a continuous signal could also be used with the oscillator circuit 2. A variety of pulse durations can be used, such as an exemplary pulse duration of 5-10 µs separated by a gap of 500 µs between each subsequent pulse. By only operating the device during the duration of the pulse signal, the duty cycle of the oscillator can be greatly reduced. An exemplary duty cycle of 1% can be achieved compared to a duty cycle of 20% for a conventional implementation transitioning from an OFF position to a high current ON position within an oscillator.

The pulses sent to the switches 6 and 8 can be used to determine the closing of the switches 6 and 8. During a low current operation period of the device, a pulse signal is not received and the switches 6 and 8 are normally open. When a pulse signal is received, the switches 6 and 8 are closed and provide an alternate current path. For example, the switches may be closed at the same time to ensure correct timing of the oscillator circuit. The switches 6 and 8 are additionally coupled to ground and to a voltage source 11, which may be provided by a battery. The switch 6 may be referred to as the base switch, and the switch 8 may be referred to as the emitter switch.

A resistor 10 is coupled in parallel with the switch 6. Additionally, the resistor 10 and the switch 6 are coupled in series to a resistor 12. The resistor 10 may possess a much larger resistance than the resistor 12 (e.g., at least one order of magnitude higher). For example, the resistor 10 may be a 3.6M resistor and the resistor 12 may be a 27 k resistor. When the switch 6 is open, the voltage from voltage source 11 is the potential that passes through both of the resistors 10 and 12 in series, encountering a resistance of 3.627M. However, when the switch 6 is closed, an alternate pathway is provided to bypass the resistor 10, and the resistance of the path is dropped to 27 k. An end of the resistor 12 is coupled to a node which is additionally coupled to a quartz crystal 18, a capacitor 20, and the base terminal of an NPN transistor 24. While the resistors 10 and 12 have been shown in a particular resistive network, other configurations could also be used.

In a similar manner as for the base switch 6, two current pathways are provided for using the switch 8. The resistor 14 is coupled between the switch 8 and ground. The switch is coupled to the emitter terminal of the NPN transistor 24. A resistor 16 is coupled between ground and the emitter terminal of the NPN transistor 24, and provides a conductive path attached to the NPN transistor 24. The resistor 16 may possess a much larger resistance than the resistor 14 (e.g., at least one order of magnitude higher). For example, the resistor 16 may be a 620 k resistor and the resistor 14 may be a 1.30 k resistor. When the switch 8 is open, the conductive path is through the resistor 16, providing a large resistance of 620 k. When the switch 8 is closed, the conductive path is through resistor 14, offering a much smaller resistance of around 1.30 k. While the resistors 14 and 16 have been shown in a particular resistive network, other configurations could also be used.

The quartz crystal 18 is coupled between the base terminal of the NPN transistor 24 and ground, and may also include two electrically conductive plates on opposite sides of the crystal. Alternatively, a ceramic material may be used in place of the crystal. Quartz crystals used within oscillator circuits typically exhibit a higher Q-value than ceramic materials, meaning that a greater amount of resistance to resonance is present and a high-power state is more difficult to achieve. For example, an exemplary frequency for the quartz crystal may be 8 MHz, but other frequencies could also be used. The mechanical resonance of the physical crystal 18 can be used along with the NPN transistor 24 to create an electrical signal with a precise frequency that offers frequency stability and decreases the amount of average current. In addition, an increased transmission rate for wireless communications may also be provided. Additionally, a capacitor 20 and a variable capacitor 22 are coupled to opposite ends of the quartz crystal 18 and both capacitors may be in the range of 5-45 pF.

The amplifying element for the oscillator circuit 2 is shown as an NPN transistor 24, although other amplifying elements such as a PNP transistor or a MOSFET transistor could be used. The base terminal is coupled through a first resistive network to the switch 6, the quartz crystal 18, and the capacitor 20, while the emitter terminal is coupled through a second resistive network to the switch 8. The collector terminal is coupled to a tank circuit 34 shown in a Colpitts type configuration. Of course, other types of tank circuits such as Pierce or Hartley tank circuits could also be used for this purpose. A capacitor 28, variable capacitor 30, and inductor 32 are coupled in parallel, with one end coupled to the collector terminal of the NPN transistor 24, and a second end coupled to the voltage source 11. Additionally, capacitor 26 is coupled between ground and voltage source 11.

Figure 2:
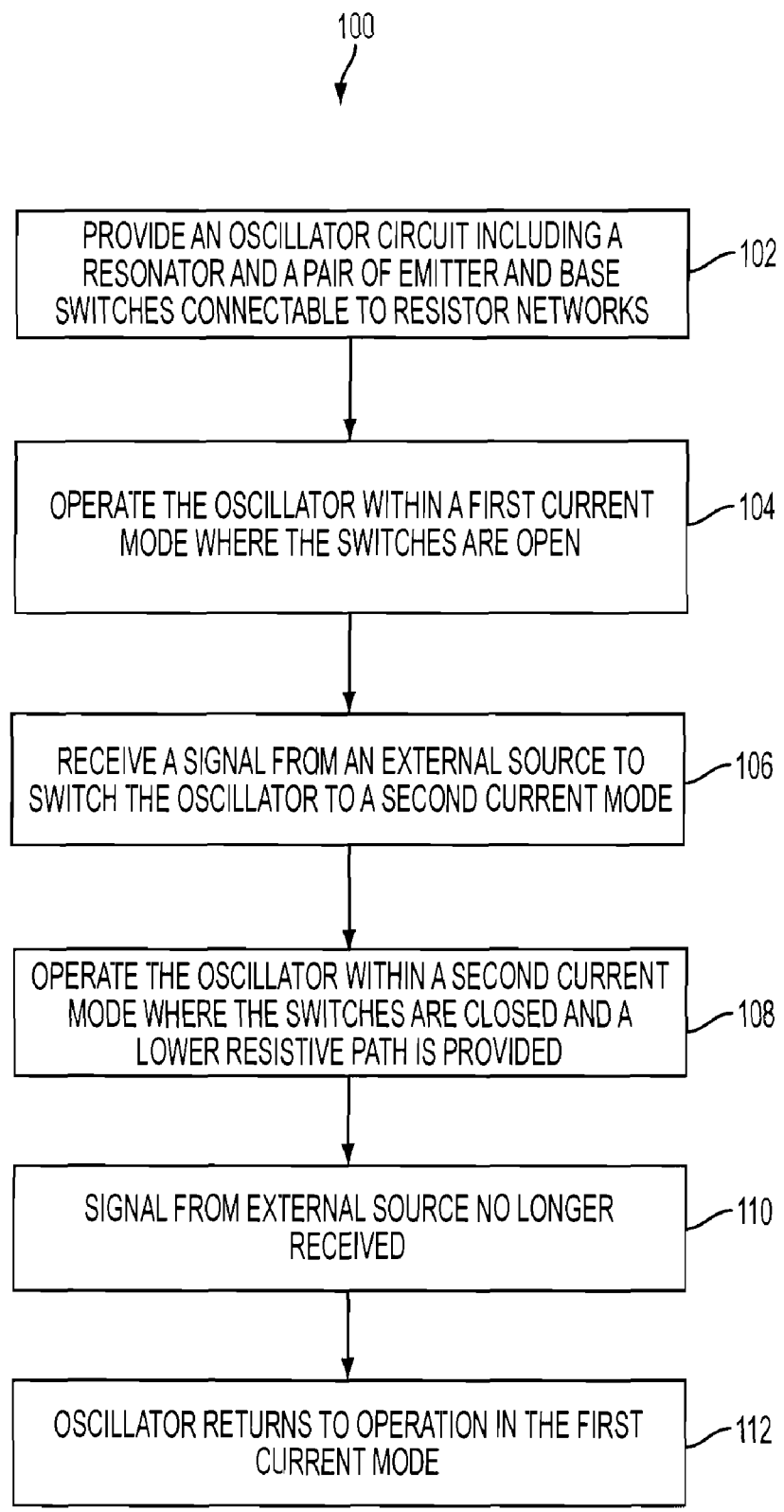
FIG. 2 is a simplified exemplary process flow showing a transition sequence for an oscillator according to an embodiment of the present invention.

FIG. 2 is a simplified exemplary process flow showing a transition sequence for an oscillator according to an embodiment of the present invention. For example, the process flow 100 may be used in conjunction with the circuit described in FIG. 1. Process flow 100 includes process 102 for providing an oscillator circuit including a resonator and a pair of emitter and base switches connectable to resistor networks, process 104 for operating the oscillator within a first current mode when both switches are open, process 106 for receiving a signal from an external source to switch the oscillator to a second current mode, process 108 for operating the oscillator within a second current mode where the switches are closed and a lower resistive path is provided, process 110 when a signal from an external source is no longer received, and process 112 for the oscillator returning to operation in the first current mode. This process flow is merely an example, which should not unduly limit the scope of the claims herein. One of ordinary skill in the art would recognize many other variations, modifications, and alternatives.

In process 100, an oscillator circuit (2) is provided that includes a resonator and a pair of emitter and base switches (6, 8) connectable to resistor networks. For example, the resonator may be a crystal or ceramic resonator (18). In process 102, the oscillator circuit is operated within a first current mode where the switches (6, 8) are open. The resistors within the resistor network may be integrated with the switches such that when the switches are open, a conductive path is provided which possesses a high resistance (resistors 10 and 12, and resistors 14 and 16). Due to the large resistance values for the resistive networks coupled to the plurality of switches, a very low current is needed to keep the resonator on in process 104. This standby current may be in the 2.2-2.7 μA range, although other current ranges are also possible.

In process 106, a signal is received from an external source to switch the oscillator circuit to a second current mode. The signal may be a pulsed signal received from an external pulse generator coupled to the oscillator circuit. The pulsed signal is received within the oscillator circuit and conveyed to the base and emitter switches. The duration of the pulsed signal may be about 5-10 μs. In process 108, the oscillator is operated within a second current mode where the switches (6, 8) are closed and a lower resistive path (resistor 12, and resistor 16) is provided. Both of the base and emitter switches are closed at the same time to present an alternate resistive path. Due to the low resistance values for the base and emitter, a relatively high current is produced, for example about 0.5-1 mA.

In process 110, the signal from the external source is no longer received and the switches are opened. As a result, the oscillator transitions to the first current mode in process 112 and a lower current is used to keep the resonator in a low-power standby mode.

The transition from the low current mode to the high current mode takes much less time than the transition from an OFF position to the high current ON position in a conventional oscillator. For example, the start up time can be reduced from about 1-10 ms to less than about 1 ms. As a result, the duty cycle can be reduced from about 20% to about 1%.

Figure 3A:
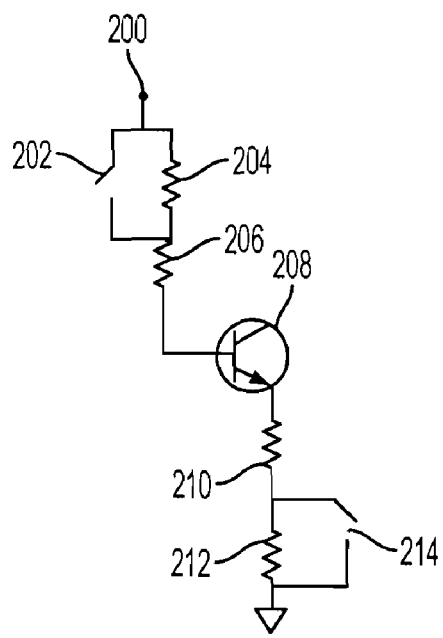
FIGS. 3A and 3B are simplified exemplary drawings of resistor configurations for use within the oscillator according to an embodiment of the present invention.
Figure 3B:
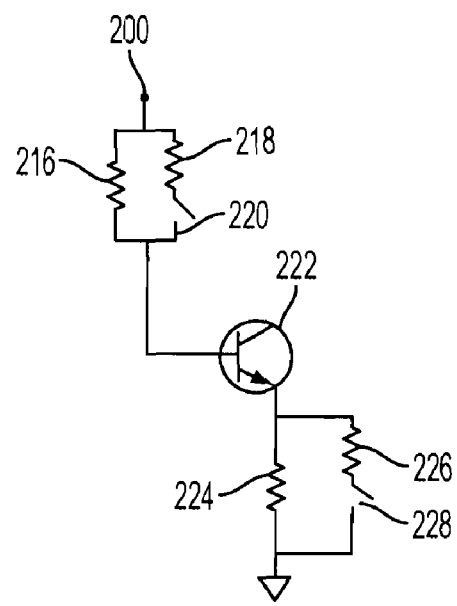

While several resistive networks have been described for use with the embodiments of the present invention, other resistor configurations could also be used. FIGS. 3A and 3B are simplified exemplary drawings of resistor configurations for use within the oscillator according to an embodiment of the present invention. In FIG. 3A, a base switch 202 is coupled in parallel with a resistor 204 and tied to a voltage source 200. Both the base switch 202 and the resistor 204 are coupled in series with a resistor 206 which possesses a resistance significantly lower than the resistance of the resistor 204. When the switch 202 is closed, an alternate current path is provided that avoids the resistor 204, allowing for a drastically reduced current. An emitter switch 214 is similarly coupled to resistors 210 and 212. The resistive path through the switch 202 and the resistor 206 is coupled to the base terminal of a NPN transistor 208, while the resistive path through the switch 214 and the resistor 210 is similarly coupled to the emitter terminal of the NPN transistor 214.

In FIG. 3B, a base switch 220 is placed in series with a resistor 218, and the switch 220 and the resistor 218 are placed in parallel with a resistor 216. The resistor 216 possesses a resistance significantly higher than that of the resistor 218. A corresponding emitter switch 228 may be similarly configured, with a resistor 224 having a significantly higher resistance than that of a resistor 226. The resistive path through the base switch 220 and the resistor 218 is coupled to the base terminal of a NPN transistor 222, while the resistive path through the emitter switch 228 and the resistor 226 is coupled to the emitter terminal of the NPN transistor 222. Of course, one of ordinary skill in the art would recognize many other variations, modifications, and alternatives.

Figure 4:
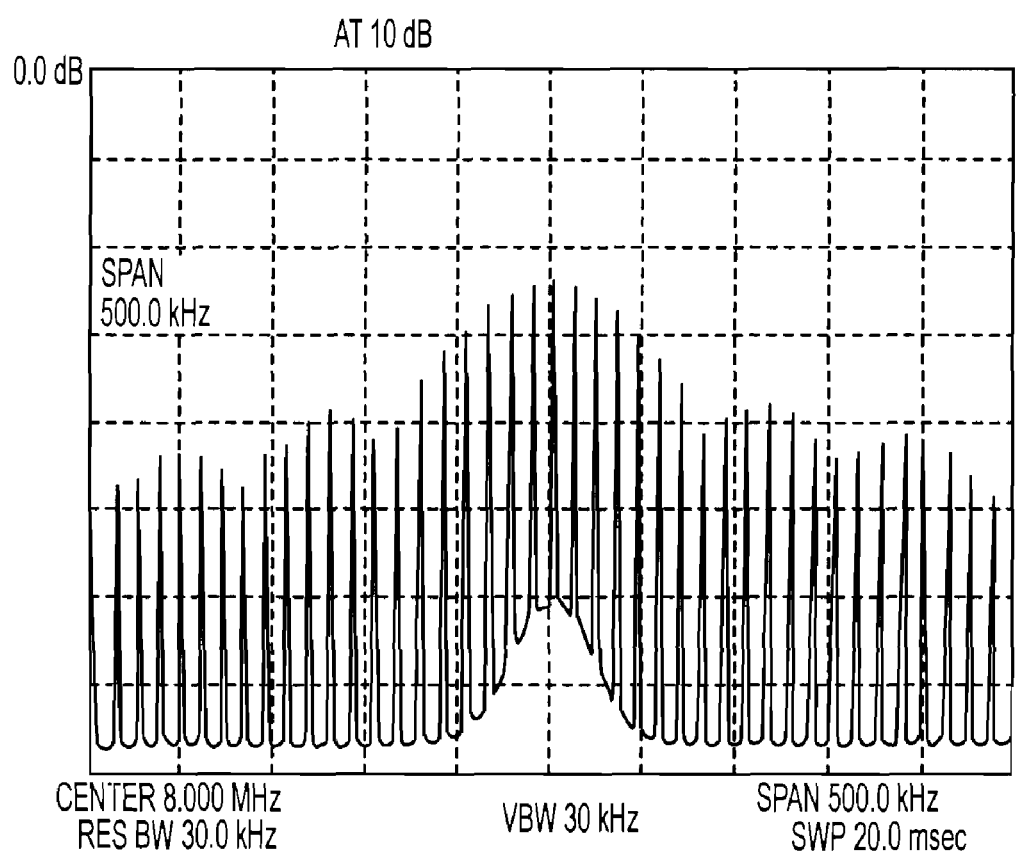
FIG. 4 is an exemplary diagram showing the output of a spectral analyzer for an oscillator according to an embodiment of the present invention.

FIG. 4 is an exemplary diagram showing the output of a spectral analyzer for an oscillator according to an embodiment of the present invention. Pulses are applied to the oscillator in a periodic manner. As shown in FIG. 4, the output exhibits a large number of spikes at a variety of frequencies due to the oscillating nature of the circuit and the pulses being applied to the oscillator. However, a consistent output within the center of the output pattern can be seen which corresponds to the frequency analyzer output for the circuit when pulses have not been applied and the switches are open. During this period, the crystal oscillator is running, but at a very low current of about 2-3 μA. As a result, the output is centered around the resonant frequency of the resonator at 8 MHz and is greater around the center frequency range.

Figure 5:
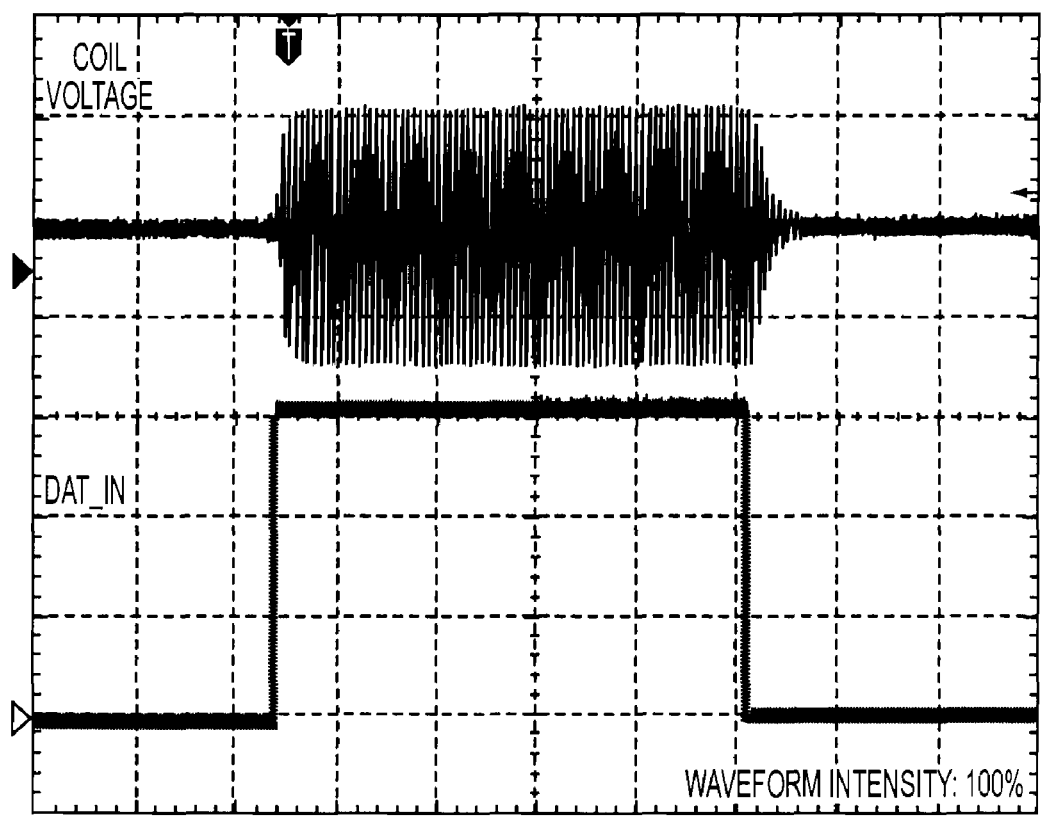
FIG. 5 is an exemplary diagram showing an applied pulse and the coil voltage for an oscillator according to an embodiment of the present invention.

FIG. 5 is an exemplary diagram showing an applied pulse and the coil voltage for an oscillator according to an embodiment of the present invention. In FIG. 5, a pulse is applied to the oscillator of approximately 10 μs and the coil voltage through the inductor within the tank circuit of the oscillator is shown in response. The quick response of the oscillator circuit within 1 μs displays the reduced start up and wind down time of the circuit when transitioning from a low-current mode to a high-current ON mode.

It is to be understood that the examples and embodiments described herein are for illustrative purposes only and that various modifications or changes in light thereof will be suggested to persons skilled in the art and are to be included within the spirit and purview of this application and scope of the appended claims.

What is claimed is:
1. An oscillator for use within an implantable medical device comprising:
   a resonator;
   a first switch coupled to a first resistive network, the first resistive network providing a first electrical path through the first switch and a second electrical path bypassing the first switch, wherein the second electrical path with the first switch opened has a substantially higher resistance than the first electrical path when the first switch is closed;

a second switch coupled to a second resistive network, the second resistive network providing a third electrical path through the second switch and a fourth electrical path bypassing the second switch, wherein the fourth electrical path with the second switch opened has a substantially higher resistance than the third electrical path when the second switch is closed; and a transistor, the base terminal coupled with the first resistive network and the resonator and the emitter terminal coupled to the second resistive network, wherein the oscillator operates in a first mode when the first and second switches are open and operates in a second mode when the first and second switches are closed; and the oscillator transitions from operating in the first mode to operating in the second mode in less than 1 ms when the first and second switches are closed.

2. The oscillator of claim 1 wherein the transistor is an NPN transistor.

3. The oscillator of claim 2 further comprising a tank circuit coupled to the collector terminal of the NPN transistor.

4. The oscillator of claim 3 wherein the tank circuit comprises:

a capacitor, a third variable capacitor, and an inductor coupled in parallel.

5. The oscillator of claim 1 wherein the first resistive network comprises a first resistor coupled in parallel with the first switch, the first resistor and the first switch both further coupled in series to a second resistor; and wherein the second resistive network comprises a third resistor coupled in parallel with the second switch, the third resistor and the second switch both further coupled in a series to a fourth resistor.

6. The oscillator of claim 1 wherein the first resistive network comprises a first resistor coupled in series with the first switch, with the first resistor and the first switch further coupled in parallel with a second resistor; and wherein the second network comprises a third resistor coupled in series with the second switch, with the third resistor and the second switch further coupled in parallel with a fourth resistor.

7. The oscillator of claim 1 wherein signals are input into the switches from an external source, the signals controlling an open or closed state of the switches.

8. The oscillator of claim 1 wherein the first and second switches are opened at the same time and are closed at the same time.

9. The oscillator of claim 1 wherein the resonator is made from a crystal or ceramic material.

10. The oscillator of claim 1 wherein the resonator is a 8 MHz resonator.

11. The oscillator of claim 1 wherein one or more of the switches are analog switches.

12. The oscillator of claim 1 wherein a duty cycle of the oscillator is about 1% or less.

13. A method of operation for a dual-mode oscillator comprising:

providing an oscillator including a resonating element, a base switch and an emitter switch, the base switch being coupled to a first resistive network and the emitter switch being coupled to a second resistive network;

operating the oscillator within a first current mode wherein the base and emitter switches are open and a first current is applied to the resonating element through the first and second resistive networks;

receiving a signal from an external source to switch the oscillator to a second current mode; and operating the oscillator within the second current mode wherein the base and emitter switches are closed providing a lower resistance path through the first and second resistive networks for a second current applied to the resonating element, the second current being substantially larger than the first current;

wherein a transition from the first current mode to the second current mode occurs in less than 1 ms when the base and emitter switches are closed.

14. The method of claim 13 further comprising:

returning the oscillator to operation within the first current mode when the signal from the external source is no longer received.

15. The method of claim 13 wherein a period between the first current mode and the second current mode is less than about 1 ms.

16. The method of claim 13 wherein the first current is about 2.2-2.7 µA.

17. The method of claim 13 wherein the second current is about 0.5-1 mA.

18. The method of claim 13 wherein the signal is a pulsed signal.

19. The method of claim 18 wherein a pulse duration of the pulsed signal is about 5-10 µs.

20. The oscillator of claim 1 wherein the oscillator transitions from operating in the first mode to operating in the second mode in less than 1 micro-second when the first and second switches are closed.

* * * * *